United States Patent [19]

Tatusko et al.

[11] 3,777,221

[45] Dec. 4, 1973

[54] MULTI-LAYER CIRCUIT PACKAGE

[75] Inventors: Philip A. Tatusko, Endwell; Richard A. Williams, Candor, both of N.Y.

[73] Assignee: International Business Machines Corporation, Armonk, N.Y.

[22] Filed: Dec. 18, 1972

[21] Appl. No.: 316,327

[52] U.S. Cl. ......... 317/101 CP, 29/626, 174/DIG. 3, 174/68.5, 317/101 CE

[51] Int. Cl. ............................................. H05k 5/00

[58] Field of Search ....................... 174/68.5, DIG. 3; 317/101 CM, 101 CP, 101 CE, 101 D; 29/625, 626

[56] References Cited

UNITED STATES PATENTS

| | | | |
|---|---|---|---|
| 3,365,620 | 1/1968 | Butler | 317/101 CP |
| 3,372,310 | 3/1968 | Kantor | 317/101 CP |
| 3,704,455 | 11/1972 | Scarbrough | 317/101 CM U |

*Primary Examiner*—Darrell L. Clay
*Attorney*—Kenneth P. Johnson et al.

[57] ABSTRACT

A pair of planar, inorganic substrates, each having generally parallel signal lines formed on a major surface, are oriented so that the circuit bearing surfaces face each other in spaced parallel relationship with the circuit lines of the two signal planes being orthogonally arranged with respect to each other and joined at selected crossover points. One substrate has circuit lines on its signal plane connected with land areas to which integrated circuit chips are attached, and the other substrate is smaller with portions cut out to expose the attached circuit chips. Circuit tabs permit edge connection to one substrate and provision is made for circuit changes adjacent the chip attachment sites. The non-adjacent major surfaces of the two substrates are optionally used as ground and voltage planes.

13 Claims, 4 Drawing Figures

MULTI-LAYER CIRCUIT PACKAGE

BACKGROUND OF THE INVENTION

Inorganic, ceramic materials are highly desirable as circuit substrates because of their inertness, stability and dielectric qualities. The materials, however, have the principal disadvantage of being difficult to machine or form once curing has occurred. Circuit lines can be easily formed on the surface of such materials and it is generally necessary to use both major surfaces for the circuit because of the attempt to miniaturize the electronic apparatus. Because of this it is necessary to form through-holes in the substrate, usually called vias, to permit placement of conductors therein that connect circuit lines on oposite sides of the substrate.

Holes can be formed in cured ceramics with high energy beams such as lasers or electron beams, but these methods are slow and expensive. The holes are usually formed by punching when the ceramic is in the soft, uncured or "green sheet" form in which the ceramic particles are held together with a volatile organic binder. The binder is later driven off in a furnace during curing. The departure of the binder produces shrinkage of the ceramic substrate, hence, changes in dimensions and hole locations. Although the amount of shrinkage can be approximated, it cannot be reliably predicted so that substrates are frequently rejected because of short circuits or open circuits after the circuit lines have been formed. Dimensional changes vary sufficiently so that the glass exposure masks cannot be reliably formed to compensate for the changes. The problem of mislocation is particularly evident on substrates bearing circuit lines having dimensions of 2 to 5 thousandths with spacings of approximately the same size. The circuit planes having signal conductors, as opposed to voltage and ground conductors, require the close spacing and a large number of vias in order to provide crossovers of one signal line and another. As conductor sizes increase, such as those used for voltage supply and ground, the criticality of hole location sharply decreases and the holes can be used that are formed in the green ceramic sheet.

It is accordingly a primary object of this invention to provide an arrangement of ceramic substrates which obviates the necessity of forming close tolerance through-holes for signal lines and offers improved flexibility in circuit design.

Another object of this invention is to provide ceramic substrate structure which is readily adaptable to printed circuit processing.

A further object of this invention is to provide a dual layered ceramic substrate structure in which the circuit lines of a pair of signal planes are spaced from each other across air as a dielectric, but in which selective soldered interconnections can be made between circuit lines of the signal planes by the use of coatings that are not wettable with solder.

Yet, another object of this invention is provision of a dual layered ceramic substrate in which active circuit components are mounted on an interior surface of one ceramic layer and are accessible for replacement through openings aligned therewith in the second ceramic layer.

A still further object of this invention is provision of a dual layered ceramic substrate in which the circuit lines of a pair of signal planes are spaced from each other on the respective adjacent interior surfaces of each ceramic layer and in which circuit changes can be made by the deletion of certain signal lines and addition of auxiliary conductors through openings in one of the ceramic layers.

SUMMARY OF THE INVENTION

The foregoing objects are attained in accordance with this invention by providing a pair of planar ceramic layers which each serve as a substrate for circuit lines on each of the two major surfaces thereof. One of the substrates is larger than the other, having an extension thereon for circuit tabs for attachment to connector devices. Circuit tabs may be provided on both ceramic surfaces by lapping the bottom and top layers. This substrate also has printed circuit signal lines formed thereon and circuit chip sites arranged for attachment of active integrated circuit chips at preselected locations. The second ceramic substrate layer is formed with an opening in alignment with each chip site that is larger than the chip to expose the circuits leading to and from the chip site on the first substrate layer. This configuration permits the construction of enlarged areas on the circuit lines leading to the chip site and portions of smaller cross-sectional areas in the circuit lines to permit the respective addition of auxiliary conductors and effective deletion of conductors by breaking the circuit lines. The circuit lines in each signal plane are arranged generally orthogonal to one another to thus permit selective soldered interconnections between the respective X and Y direction lines. Ground and voltage supply circuits are provided on the exterior major surfaces of the dual layered structure.

The foregoing structure has the significant advantage of enabling ceramic substrates to be used for fine line printed circuits and still permit the selective interconnection between signal lines without the necessity of forming a large number of circuit vias through the ceramic layer. This arrangement thus overcomes the expense and difficulty of forming circuit lines on opposite sides of a ceramic layer with great accuracy to properly register lines and vias. The arrangement also has the advantages that changes can be made to the circuits readily and circuit chips can be easily changed by solder reflow techniques. The chips are also relatively protected so that they do not protrude beyond the exterior surface of the second ceramic layer. Some through-holes are required for getting ground and voltage connections to the interior surfaces, but such holes can be made larger than the typical via and the number of holes is severely limited. The ceramic substrate arrangement provides a compact, stable arrangement which can be processed at relatively high temperatures because the substrate is not affected by high temperature.

The foregoing and other objects, features, and advantages of the invention will be apparent from the following more particular description of a preferred embodiment of the invention as illustrated in the accompanying drawings.

DESCRIPTION OF A PREFERRED EMBODIMENT

Figures 1, 2, 3, 4:
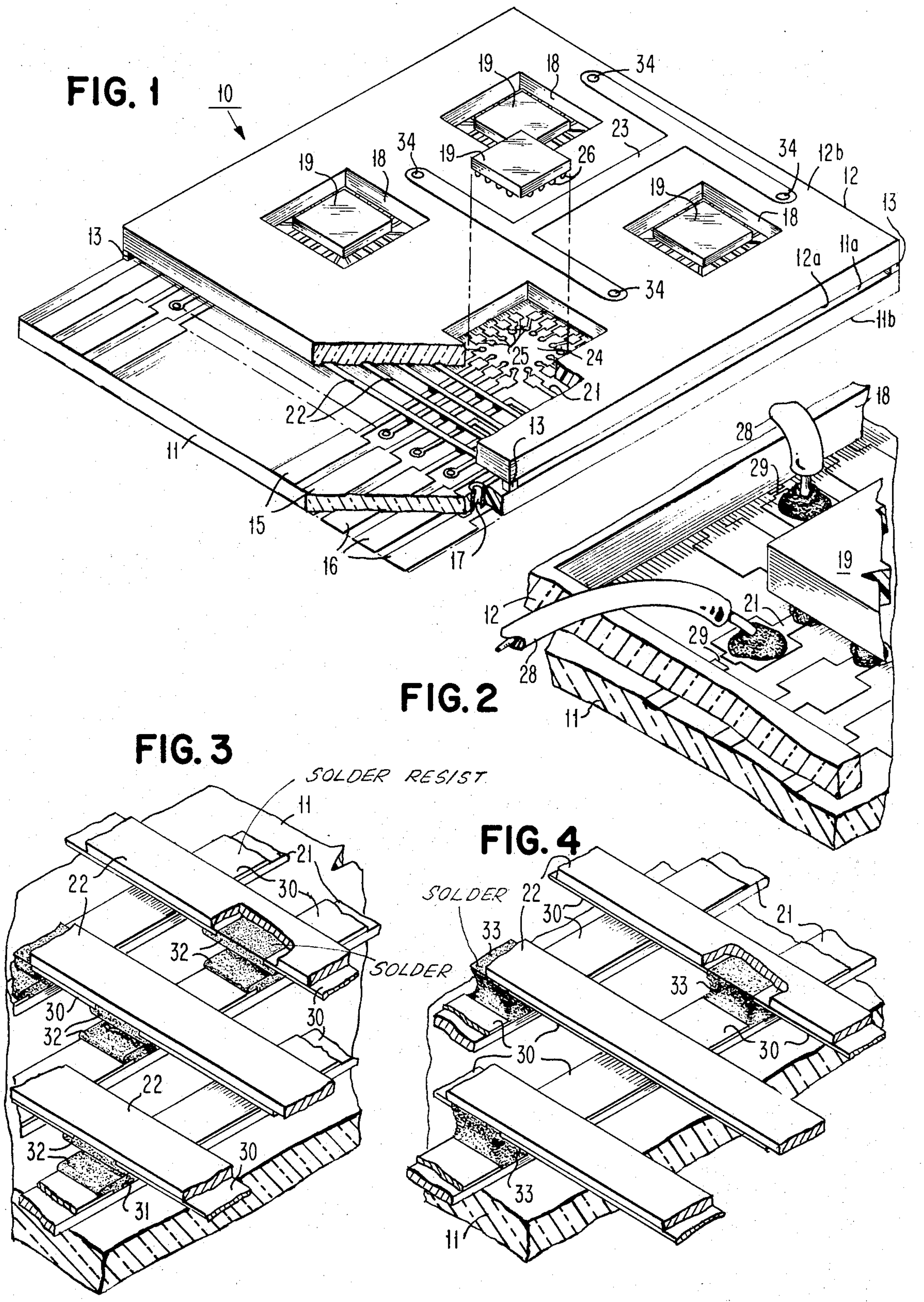
FIG. 1 is a perspective view, partially cut away, showing a circuit package constructed in accordance with the principles of the invention.
FIG. 2 is an enlarged sectional view of a portion of an integrated circuit chip site and circuit chip shown in FIG. 1.
FIGS. 3 and 4 are perspective views of interconnection areas between superposed conductors on the surface of substrates illustrating the process of forming connections between the conductors.

Referring to FIG. 1, the circuit package 10 constructed in accordance with the principles of the invention is a unitary structure comprised generally of a pair of planar substrates 11 and 12 in parallel, aligned relation. The two substrates are preferably made from the same electrically insulative material and are also preferably an inorganic ceramic material such as alumunia. However, any stable substrate which exhibits coefficient of expansion approaching that of the chip material may be used. The low expansion material need only be under the chip sites. Material such as high nickel alloys may be used as inserts in epoxy glass printed circuit materials. Each of the substrates 11 and 12 have respective signal planes 11*a* and 12*a* arranged face-to-face, and supply circuit planes 11*b* and 12*b* on the major surfaces of the substrate opposite the signal planes. The substrates are held spaced from each other a predetermined distance by supports 13 that may be either attached to the substrates or integrally formed thereon.

Lower substrate 11 is larger than its mating substrate 12 in that it has a tab portion 14 extending outwardly at one side of the two-layer structure. The tab portion has formed thereon upper contact land areas 15 and lower contact land areas 16 which allow for electrical connection with other input and output signal and supply conductors. Contact lands 16 on underside 11*b* of substrate 11 are electrically connected to necessary circuit lines on side 11*a* via through-holes 17 provided in substrate 11 interiorly coated with an electrical conductor. If additional electrical connections are required, substrate 12 may be extended and input and output conductors may be formed in a similar manner.

Substrate 12 is formed with a plurality of openings 18 which expose mounting sites for electrical devices such as integrated circuit chips 19 on surface 11a of substrate 11. The openings permit the integrated circuit chips 19 to be attached and removed from the signal plane of substrate 11, and substrate 12 provides physical protection for the chips during the handling of the circuit package 10.

On each of the major facing surfaces 11*a* and 12*a* of respective substrates 11 and 12, there are formed pluralities of circuit conductors 21 and 22 which are considered signal conductors, as opposed to supply conductors such as ground and voltage lines, and hereinafter will be considered signal planes. The opposite outer surfaces 11*b* and 12*b* of each substrate have larger conductors such as 23, which in the case of substrate 12 will serve as a voltage supply plane. On the bottom surface 11*b* of substrate 11 there are provided conductors (not shown) which serve as a ground or reference plane. Signal lines 21 on signal plane 11*a* of substrate 11 are generally oriented in a common direction, such as along the X coordinate, although the conductors are not limited solely to that direction in the signal plane. In signal plane 12*a* of substrate 12, the conductors are generally arranged in an orthogonal direction or along the Y axis and again conductors thereon are not limited to that direction.

At attachment sites for chips 19, circuit lines 21 in signal plane 11*a* are arranged about a quadrangular area 24 so that the lines are oriented along either or both the X and Y axes. These conductors each terminate in a land area 25 which is coated with solder so as to permit a fusible connection with mating solder coated terminals 26 on the underside of chips 19.

Referring to FIG. 2, a portion of each signal conductor 21 adjacent chip site 24 is exposed through openings 18 and layer 12 for the purpose of facilitating circuit changes after ceramic substrates 11 and 12 have been joined together. Each signal line 21 is formed with an enlarged auxiliary pad 27 which is accessible between the edges of chip 19 and opening 18 for the purpose of soldering or otherwise attaching auxiliary discrete wires 28 to selected ones of the enlarged pads. It should also be noted that the signal line resumes its normal width between pad 27 and the edge of the opening 18 in substrate 12. This is done to permit easy deletion of a circuit by merely removing a portion of the circuit line as shown at 29 to produce an opening between the pad and the remainder of the circuit. Deletions and additions can thus be made adjacent the circuit chip on each of its input or output circuit lines.

Interconnections are made between circuit lines 21 and 22 on the opposing, facing signal planes 11*a* and 12*a* by solder connections at selected crossover points. This manner of connection between signal lines eliminates the necessity for attempting to produce small, accurately located vias or through-holes in the ceramic substrate material. Referring to FIG. 3, there is shown a portion of substrate 11 with a plurality of signal lines 21 formed on the signal plane 11*a*. Spaced above these lines are the transversely arranged signal lines 22 supported on surface 12*a* of substrate 12 (not shown). Each signal line is formed of a suitable conductive material 30, such as copper, and is coated with a material that is preferably not wettable by molten solder, such as chromium, glass, oxides or other dielectric materials. The non-wettable coating 30 is selectively applied by plating or coating the non-wettable material on both circuit lines 21 and 22 to provide unplated areas 31 where future solder connections are to be made between lines in the two signal planes. Bodies 32 of solder are plated into these selected areas 31, defined by conventional resist techniques, such as photoresist, and are built to a higher level than the neighboring chromium 30 and allowed to overlie the chromium. The resist is then removed. The plated solder areas 32 in each signal plane are arranged so as to be opposite a mating plated solder area on the opposite signal plane when the two ceramic substrates are initially brought together. The circuit lines are given a coating of solder flux, clamped together to hold the registration required for interconnection between the signal lines, and passed through a furnace to heat and reflow the solder. The circuit chips also have their terminals aligned with mating fusible contact land areas 25 at each of the chip sites 24 and held by solder flux so that, as the substrate assembly moves to the furnace, the solder is brought to its melting point and reflows to attach the chip to the substrate circuit lines.

In the case of the orthogonally arranged signal lines 21 and 22, as seen in FIG. 4, each molten solder body 32 withdraws from the non-wettable surface of the chromium 30 and forms a globule of increased height at the crossover point. The increase in height in the globules at both of the formerly plated solder areas results in mutual contact and joining at selected connection points 33 which appear as shown in the figure. Thus, with a single pass through the furnace, all connections are made simultaneously. In the case of chip junctions, the chip terminals 26 are already in contact with the solder on the circuit lands 25 and the junctions form without the necessity of raising the height of the solder. As an alternative, solder bodies 32 can be made higher and with smaller cross-section so that mating solder masses are in contact prior to the heating and reflow. Solder can be applied either by plating or solder wave.

Substrates 11 and 12 can be readily and inexpensively produced from the "green sheet" form by stamping or punching the necessary through-holes 17, 34 and openings 18. Although the substrates will shrink nonuniformly during firing or curing, the openings 18 necessary for chip placement or the through-holes 17, 34 required for connection to the connection tabs or ground and voltage planes are relatively large compared to those required by the usual signal line through-hole so that a greater tolerance is permitted in the location of the openings. By eliminating the necessity of the signal line through-holes, these circuit lines can be produced with their usual high density without fear of open or shorted circuits. After the substrates have been cured, they are then processed to form the required conductors on the surfaces and in the desired openings.

Circuit lines can be formed on the surfaces of the ceramic substrates by several conventional printed circuit manufacturing processes. Two such processes are outlined below. In one method, the printed circuit may be formed by a patterned plating technique. In this technique the fired ceramic substrate is sensitized, usually with stannous chloride and palladium chloride, to initiate the deposition of a metal such as copper when immersed in an electroless plating bath. A thin film of copper is deposited over the entire substrate. Thereafter, a photoresist is applied, exposed, and developed to define the future circuit pattern. The substrate is then electrolytically plated to add copper in the exposed circuit areas. A new photoresist layer is applied, exposed and developed to define the areas of the circuit where chromium is required to form the areas not wettable with solder. The chromium can be electroplated by conventional electroplating techniques. Another layer of photoresist is applied, exposed, and developed to define the areas for depositing tin-lead to form the interconnection areas between signal lines. The tin-lead may be plated by conventional electroplating techniques. Each photoresist layer is preferably removed from the part before application of the next as is well known. The initial thin electroless copper layer is removed by brief immersion in an etching solution after removing the last photoresist.

Another method for manufacturing the circuitized substrates is the subtractive method in which the ceramic part is sensitized, given a thin copper plating by immersion in an electroless plating bath and then electrolytically plated to the ultimate thickness required by the circuit conductors. Photoresist layers are applied to define the areas to be coated with the plated chromium and tin-lead similar to the steps mentioned above. A photoresist is then applied which is exposed and developed to cover the circuit areas, and the remaining, unwanted copper is removed by etching.

Substrates 11 and 12 are preferably supported from each other at a uniform distance so that connections between orthogonal signal lines can be reliably formed to insure appropriate connections and maintain controlled impedance. The substrates can be supported on ceramic spacers 13, such as shown in FIG. 1. The spacers may be held in place by solder, adhesive, or mechanically.

It will be seen in FIG. 1 that circuit chips 19 may be removed when desired, merely by heating the chips sufficiently to melt solder terminals 26, thereby allowing the chip to be lifted from its chip site 24. Openings 18 allow easy access to the circuit chips so that heating devices such as resistive elements or hot gas nozzles can readily soften and melt the fused joints.

While the invention has been particularly shown and described in reference to a preferred embodiment thereof, it will be understood by those skilled in the art, that various changes in form and details may be made therein without departing from the spirit and scope of the invention.

What is claimed is:

1. A support for electrical devices comprising:

a first electrically insulative substrate having a first major surface with a plurality of electrical conductors and attachment sites for said electrical devices;

a second electrically insulative substrate having a first major surface spaced from, parallel to and facing said first major surface of said first substrate and having electrical conductors thereon, said second substrate having openings therein exposing each of said attachment sites; and electrical connections between selected ones of said conductors on said first surfaces of each of said substrates.

2. A support as described in claim 1 wherein said interconnected electrical conductors of said pluralities of conductors on each of said first major surfaces of said two substrates are arranged generally orthogonally to one another.

3. A support as described in claim 1 wherein each of said attachment sites includes a circuit device connected thereto.

4. A support as described in claim 1 further including connection tabs along at least one edge of one of said substrates.

5. A support as described in claim 1 wherein first substrate is larger than said second substrate and has conductive connection pads on its first major surface area not coextensive with the first major surface area of said second substrate.

6. A support as described in claim 1 wherein the conductors adjacent said attachment sites include enlarged, auxiliary conductive pads for selective connection of auxiliary conductors thereto.

7. A support as described in claim 1 wherein each substrate has a second major surface with electrical conductors thereon which are interconnected with selected ones of said conductors on said first major surfaces of each of said substrates via conductive elements in through-holes in said substrates.

8. A device of the class described comprising:

a first electrically insulative substrate of inorganic material having a plurality of electrical conductors arranged generally along a first direction and having predetermined conductive areas thereon for attachment of electrical devices;

a second electrically insulative substrate of inorganic material generally parallel with said first substrate and spaced therefrom, said second substrate having a plurality of electrical conductors on the surface thereof adjacent said first substrate, arranged generally along a second direction with respect to the said plurality of conductors on said first substrate, said second substrate having openings therethrough exposing said predetermined conductive areas; and a plurality of fused metal joints interconnecting selected conductors of said pluralities on said first and second substrates.

9. A support as described in claim 8 wherein the composition of said first and second substrates is a ceramic material.

10. A support as described in claim 8 wherein said first and second substrates each has a second major surface having thereon electrical supply conductors and conductive through-holes in said substrates connecting said supply conductors with selected ones of said conductors on the said respective first major surfaces of each said substrate.

11. A support as described in claim 8 wherein said fused metal joints are formed with solder.

12. A support as described in claim 8 wherein said pluralities of conductors on the first major surfaces of said first and second substrates are coated in selective areas with a material that is non-wettable by molten solder.

13. A support as described in claim 8 further including a plurality of spacers between said first and second substrates maintaining said first major surfaces in a fixed parallel relation.

* * * * *